United States Patent
Irumata et al.

(10) Patent No.: US 10,844,475 B2
(45) Date of Patent: Nov. 24, 2020

(54) METHOD FOR MANUFACTURING SPUTTERING TARGET

(71) Applicant: JX Nippon Mining & Metals Corporation, Tokyo (JP)

(72) Inventors: Shuichi Irumata, Tokyo (JP); Takashi Fukutani, Ibaraki (JP); Ryo Suzuki, Ibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 333 days.

(21) Appl. No.: 15/577,790

(22) PCT Filed: Dec. 13, 2016

(86) PCT No.: PCT/JP2016/087119
§ 371 (c)(1),
(2) Date: Nov. 29, 2017

(87) PCT Pub. No.: WO2017/115648
PCT Pub. Date: Jul. 6, 2017

(65) Prior Publication Data
US 2018/0127866 A1 May 10, 2018

(30) Foreign Application Priority Data
Dec. 28, 2015 (JP) .................. 2015-257468

(51) Int. Cl.
*B33Y 10/00* (2015.01)
*B22F 3/105* (2006.01)
*B22F 5/00* (2006.01)
*C23C 14/34* (2006.01)
*C04B 35/653* (2006.01)
*C04B 35/01* (2006.01)
*C04B 35/64* (2006.01)
*B22F 3/16* (2006.01)
*B33Y 80/00* (2015.01)

(52) U.S. Cl.
CPC ........ *C23C 14/3414* (2013.01); *B22F 3/1055* (2013.01); *B22F 3/16* (2013.01); *B22F 5/006* (2013.01); *B33Y 10/00* (2014.12); *B33Y 80/00* (2014.12); *C04B 35/01* (2013.01); *C04B 35/64* (2013.01); *C04B 35/653* (2013.01); *C04B 2235/3286* (2013.01); *C04B 2235/3293* (2013.01); *C04B 2235/5436* (2013.01); *C04B 2235/5463* (2013.01); *C04B 2235/665* (2013.01); *C04B 2235/77* (2013.01); *Y02P 10/25* (2015.11)

(58) Field of Classification Search
CPC ..... C23C 14/3414; C04B 35/64; C04B 35/01; C04B 35/653; C04B 2235/5436; C04B 2235/665; C04B 2235/3286; C04B 2235/77; C04B 2235/5463; C04B 2235/3293; B22F 3/1055; B22F 5/006; B22F 3/16; B33Y 80/00; B33Y 10/00; Y02P 10/295

See application file for complete search history.

(56) References Cited

U.S. PATENT DOCUMENTS

| | | |
|---|---|---|
| 2002/0112955 A1 | 8/2002 | Aimone et al. |
| 2005/0029094 A1 | 2/2005 | Watanabe et al. |
| 2005/0142021 A1* | 6/2005 | Aimone .............. C23C 14/3414 419/19 |
| 2007/0023281 A1 | 2/2007 | Oda |
| 2008/0271779 A1* | 11/2008 | Miller ................. C23C 14/0089 136/252 |
| 2014/0370323 A1 | 12/2014 | Ackelid |
| 2015/0034477 A1 | 2/2015 | Miller et al. |
| 2015/0050463 A1 | 2/2015 | Nakano et al. |
| 2015/0198052 A1 | 7/2015 | Pavlov et al. |
| 2017/0189962 A1* | 7/2017 | Kestler ................ B22F 1/0011 |
| 2018/0323047 A1* | 11/2018 | Strothers ............... B33Y 70/00 |

FOREIGN PATENT DOCUMENTS

| | | |
|---|---|---|
| CN | 101801565 A | 8/2010 |
| JP | 07-278804 | 10/1995 |
| JP | 10-245670 | 9/1998 |
| JP | 2004-074180 | 3/2004 |
| JP | 2004-523653 A | 8/2004 |
| JP | 2004-339607 A | 12/2004 |
| JP | 2005-516117 A | 6/2005 |
| JP | 2012-122139 A | 6/2012 |
| JP | 2013-019010 A | 1/2013 |
| JP | 2013-174019 A | 9/2013 |

(Continued)

OTHER PUBLICATIONS

Resistivity of Aluminum Oxide, hyertextbook.com (Year: 2006).*

(Continued)

*Primary Examiner* — Jessee R Roe
*Assistant Examiner* — Rebecca Janssen
(74) *Attorney, Agent, or Firm* — Marshall, Gerstein & Borun LLP

(57) ABSTRACT

(1) The present invention provides a method for manufacturing a sputtering target in which the controllability of crystal orientation is improved. Specifically, the present invention provides a method for manufacturing a sputtering target, comprising a step of shaping at least one raw material powder selected from a metal and a metal oxide into a desired target shape using an additive manufacturing method. (2) The present invention provides a method for manufacturing a sputtering target capable of improving production efficiency. Specifically, the present invention provides a method for manufacturing a sputtering target in which a backing plate and a sputter part are bonded, comprising a shaping step of shaping at least one raw material powder selected from a metal and a metal oxide into a desired sputter part shape on a backing plate or on an intermediate material provided on a backing plate using an additive manufacturing method.

9 Claims, No Drawings

(56) References Cited

FOREIGN PATENT DOCUMENTS

| JP | 2015-38237 A | 2/2015 |
| JP | 2015-507092 A | 3/2015 |
| JP | 2015-166178 A | 9/2015 |
| WO | WO-2012/144407 A1 | 10/2012 |
| WO | WO-2014/074947 A2 | 5/2014 |
| WO | WO-2014/157187 A1 | 10/2014 |
| WO | WO-2015/073081 A1 | 5/2015 |

OTHER PUBLICATIONS

Montes, J., Cuevas, F. & Cintas, J. Electrical Resistivity of Metal Powder Aggregates. Metall and Materi Trans B 38, 957-964 (2007). (Year: 2007).*

Badiru et al., Additive Manufacturing Handbook, CRC Press, pp. 132 & 255-56, May 2017 (Year: 2017).*

Search Report in International Application No. PCT/JP2016/087119 dated Mar. 21, 2017, 4 pages.

Office Action in CN Application No. 201680028904.2 dated Sep. 9, 2019, 15 pages.

International Preliminary Report on Patentability and Written Opinion in International Application No. PCT/JP2016/087119 dated Jul. 12, 2018, 9 pages.

* cited by examiner

METHOD FOR MANUFACTURING SPUTTERING TARGET

TECHNICAL FIELD

The present invention is related to a method for manufacturing a sputtering target.

BACKGROUND ART

In recent years, in many fields such as electronics fields of semiconductors, electronic component, liquid crystal displays, optical disks, solar cells and hard disks, fields of corrosion resistant materials and decorations, fields of catalyst, manufacturing cutting or abrasive materials and wear resistant materials, a sputtering method for forming a thin film of a metal or a ceramic material or the like is used. In the sputtering method, a substrate and a sputtering target are disposed to face each other, and a high voltage is applied between the substrate and the target under an inert gas atmosphere to collide electrons and ions at high speed with the target. Then, particles of the target which have been repelled are stacked on the substrate to form a film on the substrate.

Conventionally, for the purpose of controlling sputtering characteristics such as film forming speed and film characteristics such as film thickness uniformity, various studies on target structures such as crystal orientation and crystal grain size of a sputtering target have been made. In the case of a metal target, control of the target structure has been carried out by adjusting the parameters of each step such as forging, rolling, heat treatment, etc., or by devising combinations of these steps. In the case of a ceramic target, control of the target structure has been carried out by controlling the particle size distribution of the raw material powder, molding conditions, sintering conditions, and the like.

In Japanese Patent Publication No. 2013-174019 (Patent Document 1), for the purpose of obtaining a tantalum sputtering target having a high film formation rate, excellent film uniformity (uniformity), and excellent film forming characteristics with little generation of arcing and particles, it has been proposed to make the crystal orientation random. It is stated that the target is manufactured by repeating hot forging and annealing (heat treatment) of an ingot or billet obtained by electron beam melting and casting a tantalum raw material, and perform rolling and finishing process (machining, polishing, etc.).

In Japanese Patent Publication No. 2013-19010 (Patent Document 2), for the purpose of providing a copper material for a sputtering target which reduces the frequency of abnormal discharge during use and suppresses occurrence of splash etc. even when high power is applied, it has been proposed to control the average size and average crystal grain size of voids and inclusions inside the target. It is described that the copper material is manufactured through steps of melt casting—hot working—cold rolling—heat treatment.

In Japanese Patent Application No. 10-245670 (Patent Document 3), it is proposed to control the film thickness distribution by optimizing the crystal orientation, crystal structure and crystal grain size of the Ti target. It is described that the quality of the target can be adjusted by combining plastic working such as rolling and forging and heat treatment.

In WO2012/144407 (Patent Document 4) for the purpose of stabilizing the sputtering rate over a long period of time, it is proposed to maintain the crystal orientation of a high purity Ni sputtering target in random in the thickness direction. It is described that this high purity Ni sputtering target is manufactured by combining a cold or hot kneading forging process, a heat treatment process and a cold rolling process.

In WO2014/157187 (Patent Document 5), It is proposed to control the in-plane magnetic permeability in the sputtering surface and the X-ray diffraction peak intensity ratio by performing dissolution, casting, hot forging or hot rolling, heat treatment, warm rolling and machining under predetermined conditions, and it is disclosed that a cobalt sputtering target with improved sputtering efficiency and film uniformity can be obtained.

In Japanese Patent Publication No. 2004-339607 (Patent Document 6), ITO targets in which the integrated intensity of the X-ray diffraction peak (220) plane of $In_4Sn_3O_{12}$ is 90 to 300% of the integrated intensity of the X-ray diffraction peak (211) plane of $In_2O_3$, are proposed. it is described that the surface of the obtained thin film is planarized by forming the ITO thin film using the target. And it is described that the target is manufactured by molding a raw material oxide powder by a molding method such as a press method or a casting method and then sintering the same.

Furthermore, conventionally, a sputtering target is composed of a part (sputter part) made of a material to be sputtered and a part (BP part) called a backing plate having a holding function and a heat radiation function for the sputter part. Conventionally, the sputter part and the BP part were individually fabricated so as to have a predetermined plate shape and characteristics by combining heat treatment, forging and rolling, respectively. Then, these were joined by diffusion bonding, crimping, metal brazing filler materials and the like, and then subjected to rough process and finishing process so as to obtain the final shape (for example: JP2012-122139, JP2004-74180, JP7-278804, etc.).

CITATION LIST

Patent Literature

[PTL 1] Japanese Patent Publication No. 2013-174019
[PTL 2] Japanese Patent Publication No. 2013-19010
[PTL 3] Japanese Patent Publication No. 10-245670
[PTL 4] WO2012/144407
[PTL 5] WO2014/157187
[PTL 6] Japanese Patent Publication No. 2004-339607
[PTL 7] Japanese Patent Publication No. 2012-122139
[PTL 8] Japanese Patent Publication No. 2004-74180
[PTL 9] Japanese Patent Publication No. 7-278804

SUMMARY OF INVENTION

Technical Problem

As described in Patent Documents 1 to 6, in the case of a metal target, the control of the target structure has been carried out by combining the conditions of forging, rolling and heat treatment. For example, even in the case where it is preferable to make the crystal orientation oriented to a specific plane as a characteristic of the target, in the combination of these steps, although the crystal orientation can be brought close to the target value, there is a limit and it is not possible to control freely. Further, in the case of a ceramic target, forging or rolling cannot be performed because of it cracks easily, so that control of crystal orientation is more difficult.

Therefore, the first object of the present invention is to provide a manufacturing method of a sputtering target with improved controllability of crystal orientation.

In addition, as described in Patent Documents 7 to 9, in the conventional method of manufacturing a sputtering target, since steps such as plate production of BP part, plate production of sputter part, bonding of both, roughing process and finishing process are taken, the number of process steps is large and there is room for improvement in production efficiency. Also, because the shape of each plate of the BP part and the sputter part is different from the final shape of the sputtering target, the end material is generated in the processing step for forming the final shape from the plate shape. In the conventional manufacturing method, the yield of the raw material has remained only about 30 to 60%.

Therefore, the second object of the present invention is to provide a manufacturing method of a sputtering target capable of improving production efficiency, preferably a manufacturing method of a sputtering target capable of improving both production efficiency and yield.

Solution to Problem
(About the Invention for Achieving the First Object)

Even if special rolling conditions and heat treatment conditions are adopted in the prior art, there are many problems such as nonuniformity of crystal grain size and crystal orientation of solidified structure, and it is very difficult to produce a target with uniform crystal orientation. As a result of extensive studies on a method of manufacturing a sputtering target in a process different from the conventional process, the present inventors have found when an electron beam melting method (EBM) is used for metals and alloy targets, and when an additive manufacturing method such as a laser melting method (SLM) or the like is used for targets comprising ceramics such as oxides, the controllability of crystal orientation can be significantly improved as compared with the conventional manufacturing method. Further, it has been found that according to the additive manufacturing method, by using a target having desired characteristics as a substrate plate, a target inheriting the characteristics can be manufactured repeatedly.

The present invention is completed on the basis of the above knowledge and in one respect, the present invention is a method for manufacturing a sputtering target, comprising a step of shaping at least one raw material powder selected from a metal and a metal oxide into a desired target shape using an additive manufacturing method.

In one embodiment of the method for manufacturing a sputtering target according to the present invention, the additive manufacturing method is a powder bed fusion method using electron beam melting.

In another embodiment of the method for manufacturing a sputtering target according to the present invention, the raw material powder is pre-sintered under a heating condition in which the specific resistance of the raw material powder becomes $1\times10^{-4}$ Ωm or less, and then the shaping is performed under a condition in which an accelerating voltage of the electron beam is set to 50 to 70 kV, and a thickness of a shaping layer is set to 50 to 100 μm/layer, and a beam scan speed is set to 500 to 5000 m/s.

In yet another embodiment of the method for manufacturing a sputtering target according to the present invention, a metal plate with a given crystal orientation is used as a substrate plate.

In yet another embodiment of the method for manufacturing a sputtering target according to the present invention, the additive manufacturing method is a powder bed fusion method using laser melting.

In yet another embodiment of the method for manufacturing a sputtering target according to the present invention, the shaping is performed under a condition in which an output of the laser is set to 100 to 3000 W, and a thickness of a shaping layer is set to 10 to 200 μm/layer, and a laser scan speed is set to 1 to 30 m/s.

In yet another embodiment of the method for manufacturing a sputtering target according to the present invention, a plate made of metal oxide with a given crystal orientation is used as a substrate plate.

In yet another embodiment of the method for manufacturing a sputtering target according to the present invention, the raw material powder has the same composition as the substrate plate.

In yet another embodiment of the method for manufacturing a sputtering target according to the present invention, the method further comprises a step of preparing the substrate plate by cutting a sputtering target made of a metal or a metal oxide with a given characteristics into a flat plate having a predetermined thickness.

In yet another embodiment of the method for manufacturing a sputtering target according to the present invention, a thickness of the flat plate is 3 to 30 mm.

In yet another embodiment of the method for manufacturing a sputtering target according to the present invention, a particle diameter D90 of the raw material powder is 150 μm or less and a particle diameter D10 of the raw material powder is 5 μm or more.

(About the Invention for Achieving the Second Object)

As a result of extensive studies in order to solve the above problems, the inventor has found that by preparing a sputter part by using an additive manufacturing method on a BP part produced by a conventional manufacturing method, it is possible to simultaneously perform fabrication and rough processing of the sputter part, thereby reducing the number of steps. Further, When it is not necessary to provide an intermediate layer for joining the BP part and the sputter part such as the combination of a Cu alloy BP part and a Ni alloy sputter part, the shaping process of the sputter part using an additive manufacturing method also functions as a joining process, so it was found that the number of processes can be further reduced.

Further, by shaping the shape of the sputter part into a shape close to the final shape using an additive manufacturing method, loss of the material for the sputter part can be suppressed. It was also found that according to the present invention, it is also possible to make the raw material yield of the sputter part to be 90% or more, and the material cost can be greatly reduced.

The present invention is completed on the basis of the above knowledge and in one respect, the present invention is a method for manufacturing a sputtering target in which a backing plate and a sputter part are bonded, comprising a shaping step of shaping at least one raw material powder selected from a metal and a metal oxide into a desired sputter part shape on a backing plate or on an intermediate material provided on a backing plate using an additive manufacturing method.

In one embodiment of the method for manufacturing a sputtering target according to the present invention, the method further comprises performing at least one finishing process selected from shape processing and surface processing on the sputtering target in which the backing plate and the sputter part are bonded.

In another embodiment of the method for manufacturing a sputtering target according to the present invention, a ratio of a mass of the sputtering target after the finishing process to a mass of the sputtering target before the finishing process is 90% or more in a flat plate shape.

In yet another embodiment of the method for manufacturing a sputtering target according to the present invention, the method comprises:
- a step of forming a layer of the intermediate material provided on the backing plate by shaping the intermediate material on the backing plate using an additive manufacturing method;
- a shaping step of shaping at least one raw material powder selected from a metal and a metal oxide into a desired sputter part shape on the intermediate material provided on the backing plate using an additive manufacturing method.

In yet another embodiment of the method for manufacturing a sputtering target according to the present invention, the intermediate material is composed of a layer having a total thickness of 0.05 to 5 mm.

In yet another embodiment of the method for manufacturing a sputtering target according to the present invention, the additive manufacturing method is a powder bed fusion method using electron beam melting.

In yet another embodiment of the method for manufacturing a sputtering target according to the present invention, the raw material powder is pre-sintered under a heating condition in which the specific resistance of the raw material powder becomes $1 \times 10^{-4}$ Ωm or less, and then the shaping step is performed under a condition in which an accelerating voltage of the electron beam is set to 50 to 70 kV, and a thickness of a shaping layer is set to 50 to 100 μm/layer, and a beam scan speed is set to 500 to 5000 m/s.

In yet another embodiment of the method for manufacturing a sputtering target according to the present invention, a particle diameter D90 of the raw material powder is 150 μm or less and a particle diameter D10 of the raw material powder is 5 μm or more.

Advantageous Effect of Invention (Effect of the Invention Achieving the First Object)

According to the present invention of the method for manufacturing a sputtering target, since the controllability of the crystal orientation of the target is high, it becomes possible to easily obtain a sputtering target having a desired crystal orientation. Since the degree of freedom in designing the target structure is higher than in the conventional case, it is also possible to manufacture a target having a highly uniform crystal orientation which cannot be achieved by the conventional technique. In addition, according to the present invention of the method for manufacturing a sputtering target, it is possible to easily manufacture targets of the same quality repeatedly and thus improving the quality stability.

(Effect of the Invention Achieving the Second Object)

According to the present invention of the method for manufacturing a sputtering target, it is possible to increase the production efficiency of the sputtering target by decreasing the number of manufacturing steps. Further, according to the present invention of the method for manufacturing a sputtering target, in addition to improving the production efficiency, the yield of the raw material can be significantly increased, which contributes to the reduction of the production cost. The present invention can be said to be an epoch-making invention which greatly contributes to the industrial production of sputtering targets.

DESCRIPTION OF EMBODIMENTS

A preferable manufacturing method for a sputtering target using additive manufacturing method according to the present invention is described step by step as below.

<I. About the Invention to Achieve the First Object>

(1. Raw Materials)

First, at least one raw material powder selected from metals and metal oxides is prepared. The raw material for a target is generally in the form of a powder in order to be molded using an additive manufacturing method. There are no particular restrictions on the type of raw material for a target, and various metals and metal oxides can be used. In this case, in order to stabilize the target composition so as not to cause variations in the quality of the sputtered film, it is desirable to use a raw material having as little impurities as possible. Preferably, raw materials having a purity of 99.9 mass % or more, more preferably a purity of 99.99 mass % or more, still more preferably a purity of 99.999 mass % or more are used. One kind of raw material powder can be used alone, or two or more kinds can be combined.

In the case of using a metal as a raw material, it is preferable to use a simple metal such as Ti, Cu, Ta, Ni, Mn, Co, W, Ag, Al, Ru, Si, Ge, Nb, Zr, Hf, La, Y, Au, Cr, Ir, Mo, Pd, Pt, Bi, Sn, Zn and V, or alloys containing these metals can be used. As alloys containing them, Cu alloys such as Cu—Mn, Cu—Al, Cu—In—Ga (CIG), Cu—In—Ga—Se (CIGS) and Cu—Ga, Ta alloys such as Ru—Ta, Ta—Ti, Ti alloys such as Ti—Nb, Ti—Zr and Ti—Hf, Hf alloys such as Hf—Zr, Ni alloys such as Ni—Pt, Ni—Al, Ni—Si and Ni—V, W alloys such as W—Mo and W—Ti, Al alloys such as Al—Nd, Al—Si, Al—Ti, Al—Cr and Al—Zn, Au alloys such as Au—Sb, Au—As and Au—Si, Mn alloy such as Mn—Pt and Mn—Ir, Co alloys such as Co—Pt alloy, Co—Cr alloy, Co—Cr—Pt alloy, Co—Ni alloy, Co—Ni—Cr alloy, Co—Fe alloy, Co—Pd alloy, Co—Ir alloy, Co—Ru alloy, Co—Si alloy, Co—Ge alloy, Co—Mn alloy, Co—Ti alloy, Co—V alloy, Co—Ta and Co—B alloy are exemplified.

In the case of using a metal oxide as a raw material, for example, indium-tin oxide (ITO), indium-zinc oxide (IZO), indium-tin-zinc oxide (ITZO), indium-gallium-zinc oxide IGZO), zinc oxide (ZnO), tantalum oxide ($Ta_2O_5$ or the like), titanium oxide ($TiO_2$ or the like), aluminum oxide ($Al_2O_3$ or the like) can be used.

The particle size D90 of the raw material powder to be used is preferably 150 μm or less, which corresponds to the thickness of about one layer shaped using an additive manufacturing apparatus, and is preferably 125 μm or less, more preferably 100 μm or less, still more preferably 75 μm or less in order to reduce the finishing process work after shaping. Further, the particle diameter D10 of the raw material powder to be used is preferably 5 μm or more, more preferably 10 μm or more, still more preferably 20 μm or more, and still more preferably 40 μm or more in order to prevent ignition during powder handling. Here, the particle size D10, D90 are defined as: in the particle size distribution based on the volume obtained by a laser diffraction method, the particle size corresponding to the cumulative 10% from the fine part is D10, and the particle diameter corresponding to the cumulative 90% from the fine part is D90.

Any known technique can be used as the method of manufacturing the metal powder, and there is no particular restriction, but a gas atomizing method, a water atomizing method, a rotating plasma electrode method can be applied. In addition, it is possible to adopt a spherical powder obtained by induction plasma treatment of nonspherical powder. In addition, any known technique can be used for the method of producing the metal oxide powder, and there is no particular restriction, but there is a method of mixing and grinding the raw materials by known mixing and pulverizing means. Mixing and grinding can be carried out using conventional mixing and grinding machines such as a wet ball mill, a jet mill, a cross mill, a beads mill or an ultrasonic equipment. A desired particle size distribution can be obtained by classifying the raw material powder. It is also possible to adopt a spherical powder obtained by induction plasma treatment of these metal oxide powders.

(2. Shaping)

The raw material powder is uniformly mixed with a V-type mixer or the like at a desired compounding ratio and then shaped into a desired target shape using an additive manufacturing method. When only one type of metal or metal oxide is used as the raw material powder, the mixing operation as described above is unnecessary. As an additive manufacturing method, it preferable to use a powder bed fusion method (PBF) based on three-dimensional CAD data, in which the laminate shaping is performed by repeating the operation of selectively melting and solidifying by heating the vicinity of the surface of the powder bed using electron beam melting (EBM) or laser melting (SLM). According to the additive manufacturing method, since it is possible to inherit the crystal orientation and the crystal grain size of the directly underlying shaping part, it is possible to form a unidirectionally solidified structure by repeating laminating layers one by one, and for example, crystalline magnetic anisotropy of cobalt can be controlled in the vertical direction of the sputtering surface of the target.

Therefore, at the start of the additive manufacturing, when a metal, alloy or metal oxide plate having a given crystal orientation (and crystal grain size) is used as a substrate plate, and a target is shaped on the substrate plate using the additive manufacturing method, it is possible to easily obtain a target which inherits the crystal structure such as crystal orientation and crystal grain size possessed by the substrate plated. Therefore, if a part of a sputtering target having excellent characteristics is cut out and cut into a flat plate to form a substrate plate, it becomes possible to easily and repeatedly manufacture sputtering targets having excellent characteristics. The thickness required for the substrate plate is sufficient even if it is thin, and can be 3 mm or less, furthermore 2 mm or less, for example 1 to 2 mm. For this reason, for example, by preparing a thin plate having a structure with a high working degree, which is difficult to manufacture at a thickness of about 5 mm or more which is commonly used by a sputtering target, and using the obtained thin plate as a substrate plate, it is possible to easily manufacture a sputtering target having a structure which was conventionally difficult to manufacture. The substrate plate can be made of the same composition as the raw material powder and can have different compositions, but in order to accurately inherit the characteristics, it is preferable that the substrate plate has the same composition as the raw material powder.

Among the various additive manufacturing methods, EBM is preferable for shaping metals and alloy targets. By using EBM, it is possible to obtain an advantage that it is possible to manufacture a target having a highly uniformed unidirectionally solidified structure. In addition, EBM has a high output and a deep melt pool, so even when a high melting point metal is used, there is no risk of melting remaining and high-speed shaping is also possible. By performing shaping in high vacuum, oxidation in the shaping process is suppressed, and a high-quality target can be obtained. The EBM also has an advantage that cracking of the shaped object can be suppressed by performing a preliminary sintering process.

In one embodiment of the method for manufacturing a sputtering target according to the present invention, the following conditions can be adopted from the viewpoint of obtaining a unidirectionally solidified structure with high uniformity. Incidentally, preliminary sintering is a heating aimed at heating under a condition that powder of a part other than the part to be melted is lightly sintered to such an extent that conductivity between the powders can be obtained.

Shaping method: powder bed type additive manufacturing method using electron beam Preliminary sintering: heating conditions in which the specific resistance of the raw material powder becomes $1 \times 10^{-4}$ Ωm or less (e.g. $1 \times 10^{-5}$ to $1 \times 10^{-4}$ Ωm)

Raw material powder particle size: D10: 40 μm or more, D90: 150 μm or less

EB acceleration voltage: 50-70 kV

Shaping layer thickness: 50 to 100 μm/layer

Beam scanning speed: 500 to 5000 m/s

On the other hand, SLM is preferable for shaping metal oxides. In EBM, oxygen in metal oxide dissociates during shaping, but in SLM it is possible to shape so as not to cause oxygen dissociation.

In one embodiment of the method for manufacturing a sputtering target according to the present invention, the following conditions can be adopted from the viewpoint of obtaining a unidirectionally solidified structure with high uniformity.

Shaping method: powder bed type additive manufacturing method using laser

Raw material powder particle size: D10: 5 μm or more, D90: 50 μm or less

Laser output: 100 to 3000 W

Shaping layer thickness: 10 to 200 μm/layer

Laser scan speed: 1 to 30 m/s

Although the shaped article obtained in this way may be directly bonded to a backing plate as a target part, it is possible to reduce fine voids generated inside the shaped article by a hot isostatic pressing (HIP) treatment and to increase the relative density. In addition, for the purpose of shortening the initial burn-in time at the time of sputtering, the sputtering surface can be subjected to surface treatment by polishing, etching or the like.

The sputtering target obtained in this way can be bonded to a backing plate via a bonding material such as indium or diffusion bonded to a backing plate to form a sputtering target assembly. During bonding, it is desirable to carry out the bonding under conditions that do not adversely affect the crystal structure which has been produced in the previous process. For example, in the case of bonding using indium, it can be carried out in the atmosphere at 150 to 250° C. for 0.5 to 4 hours, and can be carried out typically at 170 to 250° C. for 1 to 2 hours.

Further, by laminate shaping the target using an additive manufacturing method after placing the raw material powder directly on the backing plate or indirectly via a bonding material or the like, it is possible to efficiently manufacture the assembly in which the backing plate and the sputtering target were united. In this case, it is more advantageous in terms of increasing the bonding strength if holes and/or grooves are formed in the backing plate in advance. The preferred depth of the holes and/or grooves is less than the shaping layer thickness.

(3. Grain Size)

According to one embodiment of the method for manufacturing a sputtering target according to the present invention, the average crystal grain size in the direction horizontal to the sputtering surface of the sputtering target can be controlled within the range of 1 to 300 μm depending on the shaping conditions.

The specific method of measuring the average of crystal grain size in the direction horizontal to the sputtering surface of the sputtering target is as follows. The sputtering surface is polished up to #2000 count with emery paper or the like, or buffed with alumina powder or the like, or etched with dilute sulfuric acid or dilute hydrochloric acid or the like, to expose the crystal grain boundary, and then an optical microscope is used to measure the size of the crystal grain. The size of each crystal grain is taken as the diameter of the smallest circle that can surround each crystal grain and the size is measured with respect to a number of crystal grains to such an extent that highly reliable measurement values can be obtained and the average crystal grain size is calculated.

(4. Crystal Orientation)

Although the crystal orientation has optimum crystal orientation depending on each kind and sputtering method/device, for example, in the case of a Co target which is a ferromagnetic material having a hexagonal close-packed structure (HCP), it is preferable that easy magnetization direction <0001>becomes in the direction perpendicular to the erosion plane, that is, the (0001) plane is increased on the erosion plane. In the case of using an substrate plate whose crystal structure and lattice constant are greatly different from the material (Co here) to be shaped by the additive manufacturing method or an amorphous substrate plate, since the close-packed plane ((0001) plane in hexagonal close-packed structure (HCP), (111) plane in face-centered cubic structure (fcc), (110) plane in body centered cubic structure (bcc)) is easy to grow at the shaping surface, when using Co, the plane perpendicular to the direction in which shaping proceeds tends to have a higher proportion of the (0001) plane and the plane having an angle within 15° thereto, by using a Co plate having more (0001) plane as s substrate plate, the ratio of the (0001) plane increases and becomes smaller than 15° of the angle of the plane deviated from this plane.

The average of angles of the crystal grains in the [0001] direction with respect to the thickness direction of the sputtering target on the sputtering surface is measured by exposing the crystal grain boundary using the same method as the measurement of crystal grain size and then measuring the orientation of each crystal grain by EBSP (Electron Back Scattering Pattern) method.

(5. Voids)

Since voids existing inside the target, especially large voids having a pore size of 0.05 μm or more, cause abnormal discharge during sputtering, it is desirable to minimize the voids as much as possible. According to the method for manufacturing a sputtering target according to the present invention, since the crystal structure can be easily densified by having a unidirectionally solidified structure having high uniformity, generation of voids can be effectively suppressed. Specifically, in one embodiment of the sputtering target obtained by the method for manufacturing a sputtering target according to the present invention, the number of voids having a pore size of 0.05 μm or more can be 1000 pieces/m$^2$ or less, preferably 100 pieces/cm$^2$ or less, more preferably 10 pieces/cm$^2$ or less, for example, 0 to 500 pieces/cm$^2$.

In the present invention, the number of voids having a pore diameter of 0.05 μm or more is determined by observing the sputtering surface of a sample obtained by smoothly polishing a sample cut from the target, with a high resolution FE-SEM (Field Emission Scanning Electron Microscope). The number of voids with a pore size of 0.05 μm or more per 1 cm$^2$ is counted. The pore size of 0.05 μm or more means that the diameter of the smallest circle that can surround the void is 0.05 μm or more.

(6. Relative Density)

The relative density of the sputtering target is correlated with the quality of the sputtered film. If the sputtering target has a low density, there is a possibility that particles are generated in the sputtered film due to abnormal discharge or generation of dust from the pores. In the present invention, a target having a dense unidirectionally solidified structure can be produced as described above. Specifically, in one embodiment of the sputtering target obtained by the method for manufacturing a sputtering target according to the present invention, the relative density can be 99.5% or more, and with such a high density, there is little adverse effect on film homogeneity of the sputtered film. The relative density is preferably 99.5% or more, more preferably 99.7% or more, for example 99.6 to 99.9%. The relative density of the sputtering target can be obtained by dividing the actual density calculated from the weight and external dimensions after processing the target into a predetermined shape by the theoretical density obtained from the composition of the target.

(7. Target Shape)

Although the shape of the sputtering target according to the present invention is not particularly limited, it may be a flat plate having a flat sputtering surface, for example, a disk shape (e.g. diameter: φ 156 mm to φ 750 mm, thickness: 3 mmt to 25.6 mmt), a rectangular flat plate (length: about 10 mm to 3000 mm, width: about 30 mm to 5000 mm, thickness: about 5 mmt to 30 mmt), a cylindrical shape (outer diameter: about φ 50 mm to φ 320 mm, inside diameter: about φ 40 mm to φ 300 mm, length: about 100 mm to 6000 mm). Those with large shapes, which are difficult to shape integrated with an AM shaping machine, are realized by shaping objects in a shape divided into small pieces and combining them at the time of target assembly.

<II. About the Invention for Solving the Second Problem>

(1. Raw Materials)

The raw material of the sputter part is the same as explained in the invention to achieve the first object, so its description is omitted.

(2. Backing Plate)

The backing plate can be produced by any known manufacturing method. For example, it is possible to manufacture a plate-like backing plate having predetermined characteristics and shape by combining heat treatment, forging and rolling. The backing plate is required to have a function of holding the sputter part and a function of radiating heat, and to have conductivity as it has a function as an electrode to which sputtering electric power is applied. In addition, the backing plate also needs to withstand the water pressure of the cooling water. From this viewpoint, the backing plate is required to have conductivity, thermal conductivity, heat resistance, high strength, and the like. As such materials, metals such as copper, copper alloy, titanium, titanium alloy, aluminum alloy and stainless steel can be used suitably.

(3. Intermediate Material)

By laminate shaping the target using an additive manufacturing method after placing the raw material powder directly on the backing plate or indirectly via an intermediate material (bonding material) or the like, it is possible to efficiently manufacture the assembly in which the backing plate and the sputtering target were united. In this case, it is more advantageous in terms of increasing the bonding strength if holes and/or grooves are formed in the backing plate in advance. The preferred depth of the holes and/or grooves is less than the shaping layer thickness.

Whether or not to provide an intermediate material between the backing plate and the sputter part depends on the compatibility of the backing plate and the sputter part. For example, since the bonding strength can be secured between a Cu alloy backing plate and a Ni alloy sputter part, no intermediate material is required. As for the intermediate material, a material capable of enhancing the bonding strength between the backing plate and the sputter part may be appropriately selected, and it is preferable that the intermediate material is diffusible to both. As the intermediate material, it is not restricted, but it is possible to use Ni, Ti, Zr, Hf, Al, Au, Pt, Cu, V, In, Sn, Ag, Mg, Mo and Zn alone, or an alloy containing at least one kind selected from the above, or an alloy containing at least one kind selected from the above as a main component. The intermediate material can be constituted by a layer having a total thickness of 0.05 to 5 mm, for example.

The layer of intermediate material can be deposited on the backing plate using any suitable method. As an suitable method, for example, ion plating, electroplating, electroless method and the like can be used. However, from the viewpoint of production efficiency, it is preferable to form the layer of the intermediate material on the backing plate using the additive manufacturing method described later. When a layer of intermediate material is formed using additive manufacturing method, a powdery raw material is used in the same manner as the sputter part. The particle diameter D90 of the raw material powder to be used is preferably 150 μm or less corresponding to the thickness of one layer shaped by the additive manufacturing apparatus, and is 125 μm or less in order to reduce the finishing process amount after shaping, and still more preferably 100 μm or less. In addition, the particle diameter D10 of the raw material powder to be used is preferably 10 μm or more, more preferably 20 μm or more, still more preferably 40 μm or more, in order to prevent ignition during handling of the powder.

(4. Additive Manufacturing)

In one embodiment of the method for manufacturing a sputtering target according to the present invention, a shaping step of shaping at least one raw material powder selected from a metal and a metal oxide into a desired sputter part shape on a backing plate or on an intermediate material provided on a backing plate using an additive manufacturing method is comprised. In another embodiment of the method for manufacturing a sputtering target according to the present invention, a step of forming a layer of the intermediate material provided on the backing plate by shaping the intermediate material on the backing plate using an additive manufacturing method is comprised.

Hereinafter, a manufacturing procedure of the sputter part and the intermediate material layer using an additive manufacturing method will be described. First, the raw material powder of the sputter part or the intermediate material layer is uniformly mixed with a V-type mixer or the like at a desired mixing ratio. When only one type of metal or metal oxide is used as the raw material powder, the mixing operation as described above is unnecessary. As an additive manufacturing method, it preferable to use a powder bed fusion method (PBF) based on three-dimensional CAD data, in which the laminate shaping is performed by repeating the operation of selectively melting and solidifying by heating the vicinity of the surface of the powder bed using electron beam melting (EBM) or laser melting (SLM). According to the additive manufacturing method, since it is possible to inherit the crystal orientation and the crystal grain size of the directly underlying shaping part, it is possible to form a unidirectionally solidified structure by repeating laminating layers one by one, and for example, crystalline magnetic anisotropy of cobalt can be controlled in the vertical direction of the sputtering surface of the target. In addition, in the case of forming a sputter part or an intermediate material on the backing plate, the structure of the sputter part or the intermediate material sometimes inherits the structure of the backing plate. In order to avoid this, if a raw material having a large difference in crystal structure or lattice constant is used as the raw material of the intermediate material or the sputter part, the structure will not be inherited.

Among the various additive manufacturing methods, EBM is preferable for shaping metals. By using EBM, it is possible to obtain an advantage that it is possible to manufacture a target having a highly uniformed unidirectionally solidified structure. In addition, EBM has a high output and a deep melt pool, so even when a high melting point metal is used, there is no risk of melting remaining and high-speed shaping is also possible. By performing shaping in high vacuum, oxidation in the shaping process is suppressed, and a high-quality target can be obtained. The EBM also has an advantage that cracking of the shaped object can be suppressed by performing a preliminary sintering process.

In one embodiment of the method for manufacturing a sputtering target according to the present invention, the following conditions can be adopted from the viewpoint of obtaining a unidirectionally solidified structure with high uniformity. Incidentally, preliminary sintering is a heating aimed at heating under a condition that powder of a part other than the part to be melted is lightly sintered to such an extent that conductivity between the powders can be obtained.

Shaping method: powder bed type additive manufacturing method using electron beam Preliminary sintering: heating conditions in which the specific resistance of the raw material powder becomes $1\times10^{-4}$ Ωm or less (e.g. $1\times10^{-5}$ to $1\times10^{-4}$ Ωm)

Raw material powder particle size: D10: 40 μm or more, D90: 150 μm or less

EB acceleration voltage: 50-70 kV

Shaping layer thickness: 50 to 100 μm/layer

Beam scanning speed: 500 to 5000 m/s

On the other hand, SLM is preferable for shaping metal oxides. In EBM, oxygen in metal oxide dissociates during shaping, but in SLM it is possible to shape so as not to cause oxygen dissociation.

In one embodiment of the method for manufacturing a sputtering target according to the present invention, the following conditions can be adopted from the viewpoint of obtaining a unidirectionally solidified structure with high uniformity.

Shaping method: powder bed type additive manufacturing method using laser

Raw material powder particle size: D10: 5 μm or more, D90: 50 μm or less

Laser output: 100 to 3000 W

Shaping layer thickness: 10 to 200 μm/layer

Laser scan speed: 1 to 30 m/s

Although the shaped article obtained in this way may be directly bonded to a backing plate as a target part, it is possible to reduce fine voids generated inside the shaped article by a hot isostatic pressing (HIP) treatment and to increase the relative density. In addition, for the purpose of shortening the initial burn-in time at the time of sputtering, the sputtering surface can be subjected to surface treatment by polishing, etching or the like.

In addition, by bringing the shape of the sputter part shaped using an additive manufacturing method before finishing process closer to the final shape, it is possible to remarkably improve the yield. In the conventional method of manufacturing a sputtering target, the primary objective is to obtain a structure having an average crystal grain size of 300 μm or less by combining forging, rolling, and heat treatment, so that the target material cannot be made into a shape close to a complicated final shape, hence the raw material yield is about 30 to 60%, and it was difficult to achieve high yield. According to one embodiment of the method for manufacturing a sputtering target according to the present invention, by setting the modeled shape as a shape obtained by adding the finishing process amount to the final shape of the target, the ratio of the mass of the sputtering target after finishing process to the mass of the sputtering target before finishing process in the form of a flat plate shape can be 90% more, preferably 92.5% or more, more preferably 95% or more. The ratio of the mass of the sputtering target after the finish processing to the mass of the sputtering target before the finish processing in the form of a cylindrical shape can be 70% or more, preferably 75% or more, more preferably 80% or more.

(5. Grain Size)

The average crystal grain size in the direction horizontal to the sputtering surface of the sputtering target according to the present invention is the same as explained in the invention to achieve the first object, so its description is omitted.

(6. Voids)

Voids existing inside the sputtering target is the same as explained in the invention to achieve the first object, so its description is omitted.

(7. Relative Density)

Relative density of the sputtering target is the same as explained in the invention to achieve the first object, so its description is omitted.

(8. Target shape)

The shape of the sputtering target is the same as explained in the invention to achieve the first object, so its description is omitted.

EXAMPLES

Examples of the present invention are shown below together with Comparative Examples, but these Examples are provided for a better understanding of the present invention and its advantages, and are not intended to limit the invention.

(I. About the Invention for Achieving the First Object)

Example 1

Using cobalt powder having a purity of 99.999 mass %, D10=40 μm, D90=90 μm, by powder bed type additive manufacturing method using electron beam, under a condition of preliminary sintering temperature: 900° C., electron beam acceleration voltage: 60 kV, shaping layer thickness: 100 μm/layer, beam scanning speed: 2000 m/s, a disk target of 156 mm in diameter×3 mm in thickness was fabricated. The specific resistance of the raw material powder after preliminary sintering was $7.3 \times 10^{-5}$ Ωm. The specific resistance was measured by a four-terminal method (this also applies to the following examples). At this time, the average value of 5 measurement points of PTF was 90%, and the standard deviation was 2.2%. As a result of investigating the target structure by the method described above, the average crystal grain size was 120 μm, and the average of the angles of between the normal line of the sputtering surface and the [0001] direction of each crystal grain was 5.1°, and the voids having a pore size of 0.05 μm or more was 8 pieces/cm², and the relative density was 99.9%. The crystal orientation of the target was examined every 1 mm in the thickness direction from the upper surface to the lower surface by the EBSP (Electron Back Scattering Pattern) method, and the area ratio of the (0001) plane parallel to the sputtering surface was 85%. Further, the crystal grain size of the target was examined every 1 mm in the thickness direction from the upper surface to the lower surface by the EBSP method, and the standard deviation of the crystal particle size was 30 μm.

Example 2

Using cobalt powder having a purity of 99.99 mass %, D10=40 μm, D90=110 μm, by powder bed type additive manufacturing method using electron beam, under a condition of preliminary sintering temperature: 900° C., electron beam acceleration voltage: 60 kV, shaping layer thickness: 100 μm/layer, beam scanning speed: 2000 m/s, a disk target of 156 mm in diameter×3 mm in thickness was fabricated. The specific resistance of the raw material powder after preliminary sintering was $8.1 \times 10^{-5}$ Ωm. At this time, the average value of 5 measurement points of PTF was 87%, and the standard deviation was 2.5%. As a result of investigating the target structure by the method described above, the average crystal grain size was 100 μm, and the average of the angles between the normal line of the sputtering surface and the [0001] direction of each crystal grain was 7.2°, and the voids having a pore size of 0.05 μm or more was 15 pieces/cm², and the relative density was 99.7%. The crystal orientation of the target was examined every 1 mm in the thickness direction from the upper surface to the lower surface by the EBSP method, and the area ratio of the (0001) plane parallel to the sputtering surface was 82%. Further, the crystal grain size of the target was examined every 1 mm in the thickness direction from the upper surface to the lower surface by the EBSP method, and the standard deviation of the crystal particle size was 32 μm.

Example 3

Using Co—10 wt % Pt powder having a purity of 99.99 mass %, D10=45 μm, D90=135 μm, by powder bed type additive manufacturing method using electron beam, under a condition of preliminary sintering temperature: 900° C., electron beam acceleration voltage: 60 kV, shaping layer thickness: 100 μm/layer, beam scanning speed: 2000 m/s, a disk target of 156 mm in diameter×3 mm in thickness was fabricated. The specific resistance of the raw material powder after preliminary sintering was $8.5 \times 10^{-5}$ Ωm. At this time, the average value of 5 measurement points of PTF was 92%, and the standard deviation was 4.1%. As a result of investigating the target structure by the method described above, the average crystal grain size was 80 μm, and the average of the angles between the normal line of the sputtering surface and the [0001] direction of each crystal grain was 13.5°, and the voids having a pore size of 0.05 μm or more was 12 pieces/cm², and the relative density was 99.6%. The crystal orientation of the target was examined every 1 mm in the thickness direction from the upper surface to the lower surface by the EBSP method, and the area ratio of the (0001) plane parallel to the sputtering surface was 79%. Further, the crystal grain size of the target was examined every 1 mm in the thickness direction from the upper surface to the lower surface by the EBSP method, and the standard deviation of the crystal particle size was 35 μm.

Example 4

Using Co—10 wt % Ge powder having a purity of 99.99 mass %, D10=45 μm, D90=125 μm, by powder bed type additive manufacturing method using electron beam, under a condition of preliminary sintering temperature: 900° C., electron beam acceleration voltage: 60 kV, shaping layer thickness: 100 μm/layer, beam scanning speed: 2000 m/s, a disk target of 156 mm in diameter×3 mm in thickness was fabricated. The specific resistance of the raw material powder after preliminary sintering was $7.7 \times 10^{-5}$ Ωm. At this time, the average value of 5 measurement points of PTF was 80%, and the standard deviation was 3.6%. As a result of investigating the target structure by the method described above, the average crystal grain size was 80 μm, and the average of the angles between the normal line of the sputtering surface and the [0001] direction of each crystal grain was 10.2°, and the voids having a pore size of 0.05 μm or more was 120 pieces/cm$^2$, and the relative density was 99.5%. The crystal orientation of the target was examined every 1 mm in the thickness direction from the upper surface to the lower surface by the EBSP method, and the area ratio of the (0001) plane parallel to the sputtering surface was 76%. Further, the crystal grain size of the target was examined every 1 mm in the thickness direction from the upper surface to the lower surface by the EBSP method, and the standard deviation of the crystal particle size was 29 μm.

Comparative Example 1

Using cobalt ingot having a purity of 99.999 mass % melted using electron beam, as shown in WO 2014/157187 A1, a disk target of 156 mm in diameter×3 mm in thickness was fabricated by machining a Co plate prepared by hot rolling and warm rolling the Co ingot. At this time, the average value of 5 measurement points of PTF was 65%, and the standard deviation was 6.2%. The target structure was examined by the method described above, but since the crystal grain boundary was not clear, the average crystal grain size, and the average of the angles between the normal line of the sputtering surface and the [0001] direction of each crystal grain could not be measured. Further, the voids having a pore size of 0.05 μm or more was 1 pieces/cm$^2$, and the relative density was exceeded 99.9%, and was almost 100%.

Example 5

Using Ta powder having a purity of 99.995 mass %, D10=45 μm, D90=110 μm, by powder bed type additive manufacturing method using electron beam, under a condition of preliminary sintering temperature: 1200° C., electron beam acceleration voltage: 60 kV, shaping layer thickness: 100 μm/layer, beam scanning speed: 500 m/s, a disk target of 156 mm in diameter×10 mm in thickness was fabricated. The specific resistance of the raw material powder after preliminary sintering was $9.3 \times 10^{-5}$ Ωm. The average crystal grain size was 110 μm, the voids having a pore size of 0.05 μm or more was 630 pieces/cm$^2$, and the relative density was 99.6%. The crystal orientation of the target was examined every 1 mm in the thickness direction from the upper surface to the lower surface by the EBSP method, and the area ratio of the (0001) plane parallel to the sputtering surface was 78%. Further, the crystal grain size of the target was examined every 1 mm in the thickness direction from the upper surface to the lower surface by the EBSP method, and the standard deviation of the crystal particle size was 33 μm.

Example 6

A cold rolling with a total rolling reduction of 90% or more was applied to a titanium ingot having a purity of 99.995 mass %, followed by a heat treatment at 900° C. for 1 hour, whereby a rolled plate of 156 mm in diameter×1 mm in thickness was obtained. When the crystal orientation of the sputtering surface of the rolled plate was examined by the method described above, the area ratio of the (0001) plane was 91%. The total rolling reduction is a value that cannot be achieved on a target having a thickness of about 5 to 25 mm which is a general target thickness. The surface oxide layer of the rolled plate was removed by chemical etching. Further, Ti powder having a purity of 99.995 mass %, D10=45 μm, D90=115 μm was prepared.

Using the above-described rolled plate as a substrate plate, and the above-described Ti power as a raw material, by powder bed type additive manufacturing method using electron beam, under a condition of preliminary sintering temperature: 1000° C., electron beam acceleration voltage: 60 kV, shaping layer thickness: 100 μm/layer, beam scanning speed: 2000 m/s, a disk target of 156 mm in diameter× 10 mm in thickness (including the thickness of the substrate plate) was fabricated on the above-described substrate plate. The specific resistance of the raw material powder after preliminary sintering was $8.8 \times 10^{-5}$ Ωm.

As a result of investigating the target structure by the method described above, the average crystal grain size was 120 μm, and the average of the angles between the normal line of the sputtering surface and the [0001] direction of each crystal grain was 5.1°, and the voids having a pore size of 0.05 μm or more was 23 pieces/cm$^2$, and the relative density was 99.8%. The crystal orientation of the target was examined every 1 mm in the thickness direction from the upper surface to the lower surface by the EBSP method, and the area ratio of the (0001) plane parallel to the sputtering surface was always in the range of 91±1%. Further, the crystal grain size of the target was examined every 1 mm in the thickness direction from the upper surface to the lower surface by the EBSP method, and the standard deviation of the crystal particle size was 20 μm.

Example 7

A tantalum target used for forming films with excellent film thickness uniformity was prepared. The target is manufactured into a predetermined target shape by machining after adjusting the crystal grain size and oriented structure by forging, rolling and heat treatment. Using the target, when a film having a thickness of 0.1 μm was formed on a Si substrate by a DC magnetron sputtering apparatus under a sputtering condition of an Ar gas pressure of 1 Pa and a discharge power of 6 W/cm$^2$, the film thickness uniformity measured by an X-ray reflectivity method, is about 1.2%. An unused portion of the target was processed into a flat plate of 156 mm in diameter×12 mm in thickness. On the other hand, Ta powder having a purity of 99.995 mass %, D10=45 μm, and D90=110 μm was prepared as a target material.

Using the above-described flat plate as a substrate plate, and the above-described Ta power as a raw material, by powder bed type additive manufacturing method using electron beam, under a condition of preliminary sintering temperature: 1200° C., electron beam acceleration voltage: 60 kV, shaping layer thickness: 100 μm/layer, beam scanning speed: 500 m/s, a disk target of 156 mm in diameter×12 mm in thickness (including the thickness of the substrate plate) was fabricated on the above-described substrate plate. The specific resistance of the raw material powder after preliminary sintering was $9.1 \times 10^{-5}$ Ωm.

The obtained target was bonded to a backing plate to form a target assembly, film having a thickness of 0.1 μm was formed on a Si substrate by a DC magnetron sputtering apparatus under a sputtering condition of an Ar gas pressure of 1 Pa and a discharge power of 6 W/cm². The uniformity of the thickness of the obtained film was measured by the same method as described above and found to be 1.1%.

From the above results, it can be seen that the target manufactured by the additive manufacturing method can inherit the characteristics of the target used as the substrate plate.

A tantalum target having the same characteristics as the target used in Example 7, which is used for forming films with excellent film thickness uniformity, was prepared. From an unused portion of the target, a thin plate of 156 mm in diameter×2 mm in thickness was cut out by an electric discharge wire cutting method. On the other hand, Ta powder having a purity of 99.995 mass %, D10=45 μm, and D90=110 μm was prepared as a target material.

Using the above-described thin plate as a substrate plate, and the above-described Ta power as a raw material, by powder bed type additive manufacturing method using electron beam, under a condition of preliminary sintering temperature: 1200° C., electron beam acceleration voltage: 60 kV, shaping layer thickness: 100 μm/layer, beam scanning speed: 500 m/s, a disk target of 156 mm in diameter×12 mm in thickness (including the thickness of the substrate plate) was fabricated on the above-described substrate plate. The specific resistance of the raw material powder after preliminary sintering was $9.3 \times 10^{-5}$ Ωm.

The obtained target was bonded to a backing plate to form a target assembly, film having a thickness of 0.1 μm was formed on a Si substrate by a DC magnetron sputtering apparatus under a sputtering condition of an Ar gas pressure of 1 Pa and a discharge power of 6 W/cm². The uniformity of the thickness of the obtained film was measured by the same method as described above and found to be 1.0%.

From the above results, it can be seen that the target manufactured by the additive manufacturing method can inherit the characteristics of the target used as the substrate plate.

Example 9

Using Alumina powder having a purity of 99.995 mass %, D10=45 μm, D90=110 μm, by powder bed type additive manufacturing method using laser, under a condition of laser output: 400 W, shaping layer thickness: 100 μm/layer, laser scanning speed: 5 m/s, a disk target of 30 mm in diameter×5 mm in thickness was fabricated. The structure was thermally etched at 1300° C.×1 h after polishing and examined by SEM. As a result, the average crystal grain size was 120 μm, and the average of the angles between the normal line of the sputtering surface and the [0001] direction of each crystal grain was 5.1°, and the voids having a pore size of 0.05 μm or more was 762 pieces/cm², and the relative density was 99.5%. The crystal orientation of the target was examined every 1 mm in the thickness direction from the upper surface to the lower surface by the EBSP method, and the area ratio of the (0001) plane parallel to the sputtering surface was 82%. Further, the crystal grain size of the target was examined every 1 mm in the thickness direction from the upper surface to the lower surface by the EBSP method, and the standard deviation of the crystal particle size was 35 μm.

Example 10

A backing plate made of a C18000 alloy (Cu—Cr—Ni—Si alloy) processed into a cylindrical shape having an outer diameter of 150 mm, a height of 400 mm, and a thickness of 7 mm was prepared by a combination of heat treatment, forging and rolling.

Using Titanium powder having a purity of 99.99 mass %, D10=45 μm, D90=125 μm as a raw material for sputter part, by powder bed type additive manufacturing method using electron beam, under a condition of preliminary sintering temperature: 1000° C., electron beam acceleration voltage: 60 kV, shaping layer thickness: 100 μm/layer, beam scanning speed: 2000 m/s, A cylindrical shaped article having an outer diameter of 171 mm, an inner diameter of 149 mm, and a height of 401 mm was obtained. The specific resistance of the raw material powder after preliminary sintering was $9.5 \times 10^{-5}$ Ωm.

Subsequently, the shaped article was subjected to shape processing by cutting with a lathe, and surface processing was further carried out by polishing, whereby a final sputtering target having an outer diameter of 170 mm, an inner diameter of 150 mm, and a height of 400 mm was fabricated.

As a result of investigating the target structure by the method described above, the average crystal grain size was 100 μm, and the average of the angles between the normal line of the sputtering surface and the [0001] direction of each crystal grain was 5.3°, and the voids having a pore size of 0.05 μm or more was 19 pieces/cm², and the relative density was 99.7%. The crystal orientation of the target was examined every 1 mm in the thickness direction from the upper surface to the lower surface by the EBSP method, and the area ratio of the (0001) plane parallel to the plane perpendicular to the target shaping direction was 95%. Further, the crystal grain size of the target was examined every 25 mm in the thickness direction in the longitudinal direction of the cylinder by the EBSP method, and the standard deviation of the crystal particle size was 29 μm. Further after sputtering using this target, the film thickness uniformity was measured by an X-ray reflectivity method and it was 2.1%.

(II. About the Invention for Achieving the Second Object)

Example 1

A backing plate made of a C18000 alloy (Cu—Cr—Ni—Si alloy) processed to a size of 177 mm in diameter×10.5 mm in thickness by a combination of heat treatment, forging and rolling was prepared. Further, Ti powder having a purity of 99.995 mass %, D10=45 μm, D90=110 μm was prepared. Using the Ti powder as a raw material, by powder bed type additive manufacturing method using electron beam, under a condition of preliminary sintering temperature: 850° C., electron beam acceleration voltage: 60 kV, shaping layer thickness: 100 μm/layer, beam scanning speed: 2000 m/s, a sputter part of 157 mm in diameter×10.5 mm in thickness was directly formed on the backing plate to obtain a disc-shaped sputtering target in which the backing plate and the sputter part were bonded. The mass of the obtained sputtering target was 3.22 kg. The specific resistance of the raw material powder after preliminary sintering was $7.6 \times 10^{-5}$ Ωm. The resistivity was measured by a four-terminal method (this also applies to the following examples).

Subsequently, the sputtering target was subjected to shape processing by a lathe, and surface processing was further carried out by polishing, whereby a final sputtering target having a BP portion: 176 mm in diameter×10 mm in thickness and Ti portion: 156 mm in diameter×10 mm in thickness was fabricated. The mass of the sputtering target after the finishing process was 3.04 kg. Therefore, the ratio of the mass of the sputtering target after the finishing process to the mass of the sputtering target before the finishing process was 94%.

As to the bond strength between the sputter part and the backing plate, the bending strength of the sample processed into a bending test piece was measured and found to be 8 kgf/cm² or more. Further, when the structure of the sputter part was examined by the above-described method, the average crystal grain size was 90 μm, and voids having a pore size of 0.05 μm or more was 17 pieces/cm², and the relative density was 99.7%.

Comparative Example 1

In order to achieve an outer diameter of 156 mm×an inner diameter of 150 mm×a height of 400 mm, attempts were made to create a cylinder from a cobalt ingot by combining heat treatment and forging, but it was found that compared with the aimed shape, a fluctuation of an outer diameter of 6 mm, an inner diameter of 1 mm, a height of 6 mm occurs. By inserting a round bar inside the cylinder and performing forging, the fluctuation in the inner diameter could be reduced. Because of this fluctuation, an extra thickness of ½ of the fluctuation was required, and the raw material ingot was required to have an amount corresponding to the outer diameter of 159 mm×the inner diameter of 149.5 mm×the height of 403 mm. The weight of the shaped article was 8.26 kg, and the mass of the sputtering target having the final shape of an outer diameter of 156 mm×an inner diameter of 150 mm×a height of 400 mm was 5.13 kg, which was only 62% of 8.26 kg.

Example 2

A backing plate made of pure copper processed to a size of 177 mm in diameter×10.5 mm in thickness by a combination of heat treatment, forging and rolling was prepared. As an intermediate material, In powder having a purity of 99.99 mass %, D10=40 μm, D90=120 μm was prepared. Further, $SnO_2$ powder (D10=5 μm, D90=15 μm) and $In_2O_3$ powder (D10=5 μm, D90=15 μm) were blended so as to have a weight ratio of Sn:In=1:9, and ball milled in a pot with zirconia balls to prepare a ceramic powder (D10=5 μm, D90=15 μm) for a sputter part.

On the above-described backing plate, using the above-described In power as a raw material, by powder bed type additive manufacturing method using electron beam, under a condition of preliminary sintering temperature: 100° C., electron beam acceleration voltage: 60 kV, shaping layer thickness: 100 μm/layer, beam scanning speed: 2000 m/s, a layer of the intermediate material having a thickness of 0.5 mm was fabricated. Subsequently, using the above-described ceramic power, by powder bed type additive manufacturing method using laser, under a condition of laser output: 400 W, shaping layer thickness: 100 μm/layer, laser scanning speed: 10 m/s, a sputter part of 157 mm in diameter×10.5 mm in thickness was formed on the layer of the intermediate material to obtain a disc-shaped ITO sputtering target in which the backing plate and the sputter part were bonded. The mass of the obtained sputtering target was 3.75 kg. The specific resistance of the raw material powder after preliminary sintering was $9.1 \times 10^{-5}$ Ωm.

Subsequently, the sputtering target was subjected to shape processing by a grinding processing method and further subjected to surface processing by a polishing method, whereby a sputtering target having a final shape of 156 mm in diameter×10 mm thickness was fabricated. The mass of the sputtering target after the finishing process was 3.53 kg. Therefore, the ratio of the mass of the sputtering target after the finishing process to the mass of the sputtering target before the finishing process was 94%.

As to the bond strength between the sputter part and the backing plate, the bending strength of the sample processed into a bending test piece was measured and found to be 0.5 kgf/cm² or more. Further, when the structure of the sputter part was examined by the above-described method, the average crystal grain size was 130 μm, and voids having a pore size of 0.05 μm or more was 482 pieces/cm², and the relative density was 99.5%.

The invention claimed is:

1. A method for manufacturing a sputtering target, comprising a step of shaping at least one raw material powder selected from a metal and a metal oxide directly on a substrate plate made of metal, alloy, or metal oxide with a given crystal orientation using an additive manufacturing method, wherein the additive manufacturing method is a powder bed fusion method using electron beam melting or laser melting.

2. The method according to claim 1, wherein the raw material powder is preliminarily sintered and has a specific resistance of $1 \times 10^{-4}$ Ωm or less, and the shaping step is performed under a condition in which an accelerating voltage of an electron beam is set to 50 kV to 70 kV, a thickness of a shaping layer is set to 50 μm/layer to 100 μm/layer, and a beam scan speed is set to 500 m/s to 5000 m/s.

3. The method according to claim 1, comprising performing the shaping step under a condition in which an output of the laser is set to 100 W to 3000 W, a thickness of a shaping layer is set to 10 μm/layer to 200 μm/layer, and a laser scan speed is set to 1 m/s to 30 m/s.

4. The method according to claim 1, wherein the raw material powder has the same composition as the substrate plate.

5. The method according to claim 1, wherein the substrate plate is made of metal, and the method further comprises a step of preparing the substrate plate by cutting a sputtering target made of the metal with given characteristics into a flat plate having a predetermined thickness.

6. The method according to claim 5, wherein the predetermined thickness of the flat plate is 3 mm to 30 mm.

7. The method according to claim 1, wherein a particle diameter D90 of the raw material powder is 150 μm or less and a particle diameter D10 of the raw material powder is 5 μm or more.

8. The method according to claim 1, wherein the substrate plate is made of metal oxide, and the method further comprises a step of preparing the substrate plate by cutting a sputtering target made of the metal oxide with given characteristics into a flat plate having a predetermined thickness.

9. A method for manufacturing a sputtering target, comprising a step of shaping at least one raw material powder selected from a metal and a metal oxide directly on a substrate plate made of metal, alloy, or metal oxide using an additive manufacturing method, wherein the substrate plate is prepared separately from the sputtering target, and the additive manufacturing method is a powder bed fusion method using electron beam melting of laser melting.

* * * * *